United States Patent
Katoch et al.

(10) Patent No.: US 10,789,994 B2
(45) Date of Patent: Sep. 29, 2020

(54) MEMORY ARCHITECTURE HAVING FIRST AND SECOND VOLTAGES

(71) Applicant: TAIWAN SEMICONDUCTOR MANUFACTURING COMPANY, LTD., Hsinchu (TW)

(72) Inventors: Atul Katoch, Kanata (CA); Cormac Michael O'Connell, Kanata (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/660,282

(22) Filed: Oct. 22, 2019

(65) Prior Publication Data

US 2020/0051597 A1 Feb. 13, 2020

Related U.S. Application Data

(63) Continuation of application No. 15/915,242, filed on Mar. 8, 2018, now Pat. No. 10,468,075, which is a
(Continued)

(51) Int. Cl.
*G11C 5/14* (2006.01)
*G11C 11/412* (2006.01)
(Continued)

(52) U.S. Cl.
CPC ............ *G11C 5/147* (2013.01); *G11C 11/412* (2013.01); *G11C 11/417* (2013.01); *G11C 11/418* (2013.01); *G11C 11/419* (2013.01)

(58) Field of Classification Search
CPC .............................. G11C 5/147; G11C 11/412
(Continued)

(56) References Cited

U.S. PATENT DOCUMENTS 6,111,779 A 8/2000 You
6,724,648 B2 4/2004 Khellah et al.
(Continued)

FOREIGN PATENT DOCUMENTS

| CN | 102105941 | 6/2011 |
|---|---|---|
| KR | 20110122411 | 11/2011 |
| KR | 20120037187 | 4/2012 |

OTHER PUBLICATIONS

Office Action dated Sep. 21, 2017 from corresponding No. CN 201410830586.4.
(Continued)

*Primary Examiner* — Son L Mai
(74) *Attorney, Agent, or Firm* — Hauptman Ham, LLP

(57) ABSTRACT

A memory macro includes: word lines; memory cells arranged in an array, the array including rows and columns, the rows corresponding to the word lines, each memory cell being configured to receive a first reference voltage, and each column having voltage supply nodes corresponding to corresponding ones of the memory cells in the column; and switching circuits corresponding to the columns, each switching circuit being configured to selectively provide a first voltage value of a first voltage source or a second voltage value of a second voltage source to the voltage supply nodes; and wherein the first and second voltage values differ by a predetermined voltage value; each of the first and second voltage values is different than a second reference supply voltage; and the word lines are configured to receive the second voltage value as a voltage value representing a high logical value of the word lines.

20 Claims, 4 Drawing Sheets

Related U.S. Application Data continuation of application No. 14/461,156, filed on Aug. 15, 2014, now Pat. No. 9,916,874.

(51) Int. Cl.
*G11C 11/417* (2006.01)
*G11C 11/418* (2006.01)
*G11C 11/419* (2006.01)

(58) Field of Classification Search
USPC .......................................... 365/156, 189.09
See application file for complete search history.

(56) References Cited

U.S. PATENT DOCUMENTS

| | | |
|---|---|---|
| 6,791,864 B2 | 9/2004 | Houston |
| 7,020,041 B2 | 3/2006 | Somasekhar et al. |
| 7,113,421 B2 | 9/2006 | Maeda et al. |
| 7,236,408 B2 | 6/2007 | Joshi |
| 7,313,032 B2 | 12/2007 | Ellis et al. |
| 7,586,806 B2 | 9/2009 | Wong |
| 7,613,031 B2 | 11/2009 | Hanafi |
| 7,679,948 B2 | 3/2010 | Park et al. |
| 7,701,755 B2 | 4/2010 | Chen et al. |
| 7,733,687 B2 | 6/2010 | Kengeri et al. |
| 7,817,460 B2 | 10/2010 | Yamagami |
| 7,903,483 B2 | 3/2011 | Russell |
| 8,004,907 B2 | 8/2011 | Russell et al. |
| 8,077,510 B2 | 12/2011 | Ouchi et al. |
| 8,159,862 B2 | 4/2012 | Kim et al. |
| 8,243,541 B2 | 8/2012 | Cho et al. |
| 8,270,241 B2 | 9/2012 | Tao |
| 8,315,117 B2 | 11/2012 | Zhang et al. |
| 8,345,470 B2 | 1/2013 | Satomi et al. |
| 8,385,149 B2 | 2/2013 | Yang et al. |
| 8,576,611 B2 | 11/2013 | Hsu |
| 8,817,568 B2 * | 8/2014 | Tao .......................... G11C 5/14 365/226 |
| 9,001,572 B2 | 4/2015 | Choi et al. |
| 9,007,815 B2 * | 4/2015 | Liaw ..................... G11C 11/417 365/154 |
| 2003/0214833 A1 | 11/2003 | Hsu et al. |
| 2007/0121370 A1 | 5/2007 | Ellis et al. |
| 2008/0112212 A1 | 5/2008 | Wang et al. |
| 2008/0159014 A1 | 7/2008 | Dray et al. |
| 2009/0129193 A1 | 5/2009 | Joshi et al. |
| 2009/0207650 A1 | 8/2009 | Braceras et al. |
| 2009/0207675 A1 | 8/2009 | Kengeri et al. |
| 2009/0303819 A1 | 12/2009 | Park et al. |
| 2010/0128541 A1 | 5/2010 | Russell et al. |
| 2011/0103126 A1 | 5/2011 | Satomi et al. |
| 2012/0019312 A1 | 1/2012 | Kim et al. |

OTHER PUBLICATIONS

Notice of Allowance dated Jul. 28, 2017 and English translation from corresponding No. KR 10-2014-0182395.
Office Action dated Jun. 2, 2016 and English translation from corresponding No. KR 10-2014-0182395.

\* cited by examiner

MEMORY ARCHITECTURE HAVING FIRST AND SECOND VOLTAGES

PRIORITY CLAIM

The present application is a continuation of U.S. application Ser. No. 15/915,242, filed Mar. 8, 2018, now U.S. Pat. No. 10,468,075, issued Nov. 5, 2019, which is a continuation of U.S. application Ser. No. 14/461,156, filed Aug. 15, 2014, now U.S. Pat. No. 9,916,874, issued Mar. 13, 2018, each of which is incorporated herein by reference in their entireties.

BACKGROUND

In some approaches, as memory cells are manufactured by technology nodes that are more advanced than previous technology nodes, the supply voltage of the memory cells operates at a decreased value compared with the supply voltage of the previous nodes. As a result, read stability of the memory cells causes concerns.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
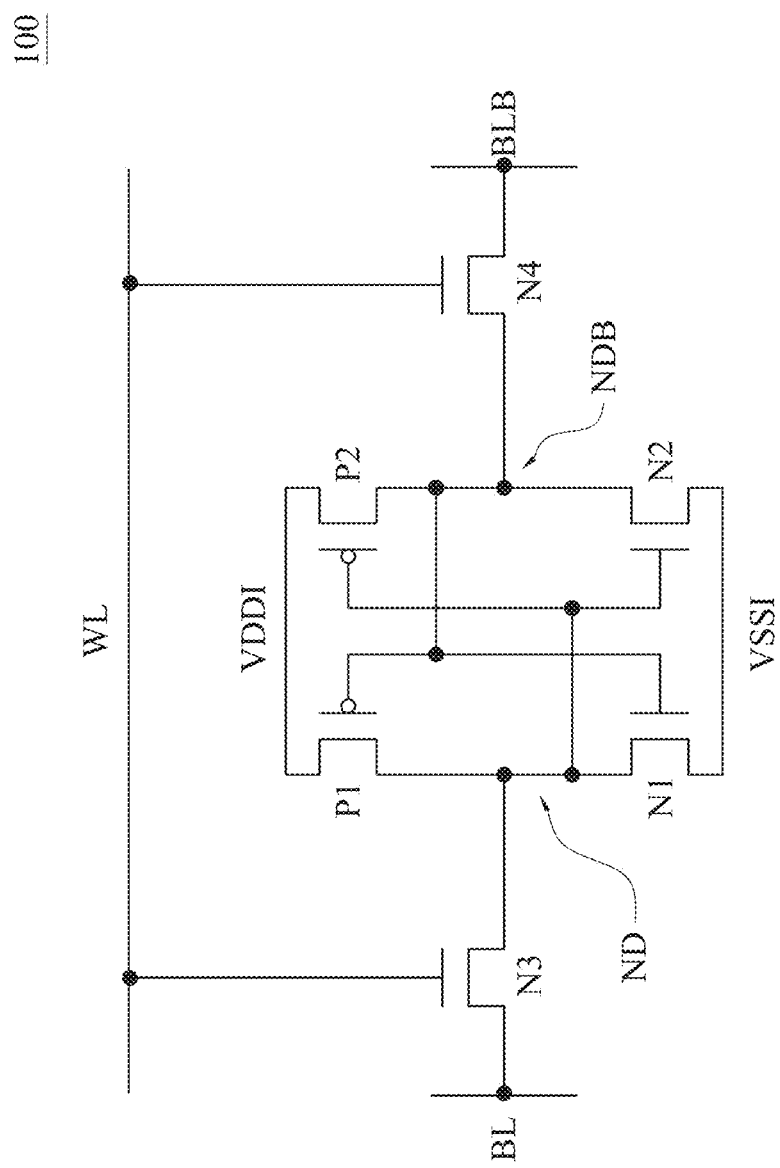
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a memory macro includes a first supply voltage called a cell supply voltage and a second supply voltage called a periphery supply voltage. The periphery supply voltage is used in periphery circuits that include a word line driver. Memory cells in the memory macro receive the cell supply voltage or the periphery supply voltage, depending on their operations. A value of the cell supply voltage is higher than that of the periphery supply voltage by a predetermined amount.

In some embodiments, a memory cell under a write operation causes a dummy read to memory cells coupled to the same word line with the memory cell under the write operation. In some embodiments, memory cells in columns having a memory cell under a write operation receive the periphery supply voltage. In contrast, memory cells in columns having a memory cell under a dummy read receive the memory cell voltage. As a result, both values of the cell supply voltage and the periphery supply voltage can be lowered or scaled down, compared to other approaches. Further, active and leakage power reduction are also achieved.

Memory Cell

FIG. 1 is a circuit diagram of a memory cell 100, in accordance with some embodiments.

Memory cell 100 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or cross-coupled inverters. Transistors P1 and N1 form a first inverter while transistors P2 and N2 form a second inverter. Drains of transistors P1 and N1 are coupled together and form a node ND. Drains of transistors P2 and N2 are coupled together and form a node NDB. Gates of transistors P1 and N1 are coupled together and to drains of transistors P2 and N2. Gates of transistors P2 and N2 are coupled together and to drains of transistors P1 and N1. Sources of transistors P1 and P2 are coupled together as a node NVDDI (not shown) having a supply voltage VDDI. Sources of transistors N1 and N2 are coupled as a node NVSSI (not shown) having a supply voltage VSSI.

A word line WL is coupled with a gate of each of transistors N3 and N4 of memory cell 100. In a memory array, word line WL is coupled with gates of transistors N3 and N4 of a plurality of memory cells 100 in a row of memory cells. Word line WL is also called a write control line because the signal on word line WL controls transistors N3 and N4 for data on bit lines BL and BLB to be written to and read from corresponding nodes ND and NDB.

Each of transistor N3 and transistor N4 is called a pass gate transistor. Drains of transistors N3 and N4 are coupled to the pair of bit lines BL and BLB, respectively. In a memory array, bit lines BL and BLB are coupled to each drain of transistors N3 and N4 of a plurality of memory cells 100 in a column of the memory array. Each of bit lines BL and BLB is also called a write data line because the data carried on bit lines BL and BLB is written to and read from corresponding nodes ND and NDB.

In a write operation of memory cell 100, data to be written to memory cell 100 is applied to bit lines BL and BLB. Word line WL is then activated to turn on transistors N3 and N4. As a result, the data on bit lines BL and BLB is transferred to, and is stored in, corresponding nodes ND and NDB.

For illustration, a low and a high logical value are written to nodes ND and NDB, respectively. As a result, corresponding low and high logical values are applied to bit lines BL and BLB to be transferred to corresponding nodes ND and NDB. In some embodiments, both bit lines BL and BLB are pre-charged to a high logical value. Pre-charge refers to charging to a high logical value before writing. Bit line BL is then pulled to ground or a reference supply voltage VSS to have a low logical value. The low logical values on bit line BL and BLB are then transferred to nodes ND and NDB, respectively.

In a read operation of memory cell 100, word line WL is activated to turn on transistors N3 and N4. As a result, the data stored on nodes ND and NDB is transferred to bit lines BL and BLB. The data on bit lines BL and BLB is then processed to indicate the data stored in nodes ND and NDB.

For illustration, a low and a high logical value are stored on nodes ND and NDB, respectively. In some embodiments, both bit lines BL and BLB are pre-charged to a high logical value. Word line WL is activated to turn on transistors N3 and N4. The low logical value on node ND causes bit line BL to be logically low. In contrast, bit line BLB remains at the high logical value. Effectively, the data stored in nodes ND and NDB is transferred to bit lines BL and BLB, respectively. The low and high logical values on bit lines BL and BLB are then processed to reveal the data stored in nodes ND and NDB respectively.

Memory Macro

Figure 2:
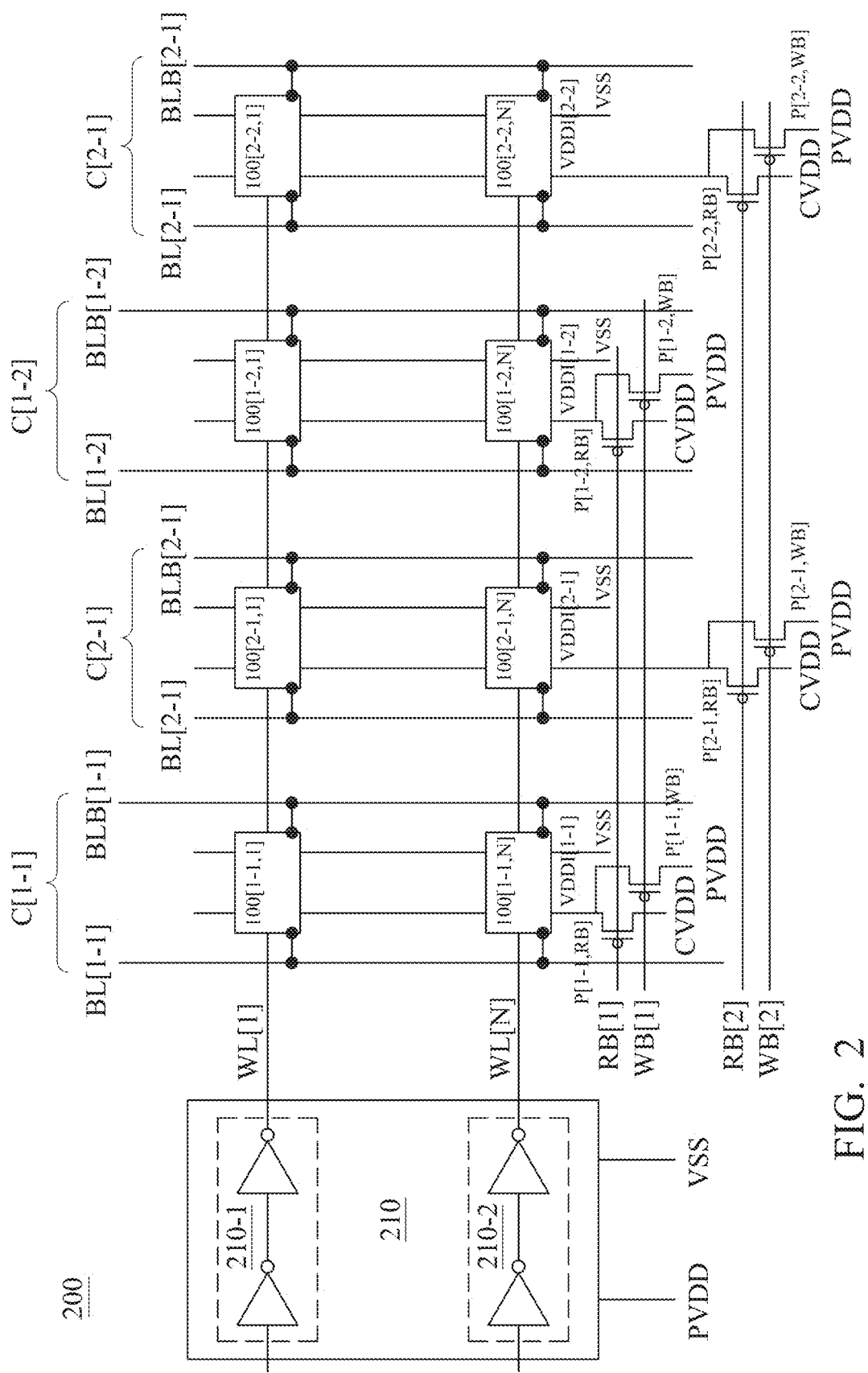
FIG. 2 is a diagram of a memory macro having a plurality of memory cells in FIG. 1, in accordance with some embodiments.

FIG. 2 is a diagram of a memory macro 200, in accordance with some embodiments. Memory macro 200 includes a plurality of memory cells 100 arranged in an array having N rows of memory cells 100 and four columns of memory cells 100 labeled as columns C[1-1], C[2-1], C[1-2], and C[2-2]. Columns C[1-1] and C[2-1] belong to a first group coupled with a multiplexer 300 as explained with reference to FIG. 3. Similarly, columns C[1-2] and C[2-2] belong to a second group, and is also explained with reference to FIG. 3. Four columns are used for illustration. A different number of columns is within the contemplated scope of the present disclosure. For example, in some embodiments, there are more than two groups and/or more columns in a group.

Each of word lines WL[1] to WL[N] corresponds to word line WL in FIG. 1 and a row of memory cells 100 of memory macro 200. N is an integer number indicating memory macro 200 includes N number of rows. Word line driver 210 provides signals to word lines WL[1] to WL[N]. Word line driver 210 includes drivers 210-1 to 210-N corresponding to N rows of memory macro 200. Drivers 210-1 to 210-N each include a pair of inverters. Other circuits in place of the pair of inverters that form a driver 210-1 to 210-N are within the contemplated scope of the present disclosure.

In some embodiments, circuits in word line driver 210 receives a periphery voltage PVDD on a node NPVDD (not shown) as a supply voltage, and receives a voltage VSS on a node NVSS (not shown) as a reference supply voltage. Word line driver 210 in turn provides voltage PVDD as a voltage value for a high logical value to word lines WL[1] to WL[N].

Columns C[1-1] and C[2-1], through corresponding bit lines BL[1-1], BLB[1-1] and BL[2-1], BLB[2-1] are coupled with a multiplexer 300 in FIG. 3, which will be explained with reference to FIG. 3. Similarly, columns C[1-2] and C[2-2] are coupled with another multiplexer 300' (not shown) discussed in FIG. 3, which will also be explained with reference to FIG. 3. In some embodiments, based on corresponding multiplexers 300 and 300', bit lines BL[1-1], BLB[1-1] and BL[1-2], BLB[1-2] of columns C[1-1] and C[1-2] are selected at the same time, while bit lines BL[2-1], BLB[2-1] and BL[2-2], BLB[2-2] of columns C[2-1] and C[2-2] are selected at the same time.

PMOS transistors P[1-1,RB] and P[1-1,WB] are part of column C[1-1]. PMOS transistors P[2-1,RB] and P[2-1,WB] are part of column C[2-1]. PMOS transistors P[1-2,RB] and P[1-2,WB] are part of column C[1-2]. PMOS transistors P[2-2,RB] and P[2-2,WB] are part of column C[2-2]. The pairs of transistors P[1-1,RB] and P[1-1,WB], P[2-1,RB] and P[2-1,WB], P[1-2,RB] and P[1-2,WB], P[2-2,RB] and P[2-2,WB] are each called a switching circuit to switch between voltage PVDD or voltage CVDD to a corresponding column of memory macro 200. Other switching circuits are within the contemplated scope of the present disclosure.

Drains of transistors P[1-1,RB] and P[1-1,WB] are coupled with nodes NVDDI of memory cells 100[1-1,1] to 100[1-1,N] of column C[1-1] through a node NVDDI[1-1] (not labeled) having voltage VDDI[1-1]. Drains of transistors P[1-2,RB] and P[1-2,WB] are coupled with nodes NVDDI of memory cells 100[1-2,1] to 100[1-2,N] of column C[1-2] through a node NVDD[1-2] (not labeled) having a voltage VDDI[1-2]. Drains of transistors P[2-1,RB] and P[2-1,WB] are coupled with nodes NVDDI of memory cells 100[2-1,1] to 100[2-1,N] of column C[2-1] through a node NVDDI[2-1] (not labeled) having a voltage VDDI[2-1]. Drains of transistors P[2-2,RB] and P[2-2,WB] are coupled with nodes NVDDI of memory cells 100[2-2,1] to 100[2-2,N] of column C[2-2] through a node NVDDI[2-2] (not labeled) having a voltage VDDI[2-2].

Sources of transistors P[1-1,RB], P[1-2, RB], P[2-1, RB], and P[2-2, RB] are coupled with a node NCVDD (not labeled) having a voltage CVDD. Sources of transistors P[1-1,WB], P[1-2, WB], P[2-1, WB], and P[2-2, WB] are coupled with a node NPVDD (not labeled) having a voltage PVDD.

Gates of transistors P[1-1,RB] and P[1-2, RB] receive signal RB[1]. Gates of transistors P[1-1,WB] and P[1-2, WB] receive signal WB[1]. Gates of transistors P[2-1,RB] and P[2-2, RB] receive signal RB[2]. Gates of transistors P[2-1,WB] and P[2-2, WB] receive signal WB[2]. Signals RB[1], WB[1], RB[2], and WB[2] are provided by corresponding signal sources, which, for simplicity, are not shown.

Signals RB[1] and WB[1] turn on or off corresponding transistors P[1-1,RB] and P[1-1,WB]. In some embodiments, signals RB[1] and WB[1] are each a logical inverse of one another. As a result, when transistor P[1-1,RB] is on, transistor P[1-1,WB] is off, and vice versa. For example, when signal RB[1] is logically low, transistor P[1-1, RB] is on. At the same time, signal WB[1] is logically high and transistor P[1-1, WB] is off.

PMOS transistors P[1-1,RB] and P[1-1,WB] are used to provide either voltage CVDD or voltage PVDD to nodes NVDDI of memory cells 100[1-1,1] to 100[1-1,N] through node NVDDI[1-1]. For example, when transistor P[1-1,RB] is on and transistor P[1-1,WB] is off, voltage CVDD at the source of transistor P[1-1,RB] is transferred to the drain of transistor P[1-1,RB], which is node NVDD[1-1] coupled to nodes NVDDI of memory cells 100[1-1,1] to 100[1-1,N]. Effectively, nodes NVDDI of memory cells 100[1-1,1] to 100[1-1,N] each have voltage CVDD.

In contrast, when transistor P[1-1,WB] is on and transistor P[1-1,RB] is off, voltage PVDD at the source of transistor P[1-1,WB] is transferred to the drain of transistor P[1-1, WB], which is node NVDD[1-1] coupled to nodes NVDDI of memory cells 100[1-1,1] to 100[1-1,N]. Effectively, nodes NVDDI of memory cells 100[1-1,1] to 100[1-1,N] each have voltage PVDD.

In some embodiments, voltage CVDD is higher than voltage PVDD by a predetermined voltage $\Delta V$, such as 50 mV. In some embodiments, voltage $\Delta V$ is obtained through simulation based on a number of selected memory cells, which varies depending on various factors, such as those used in a statistical model, Monte Carlo simulation, a predetermined yield value, etc. For example, a value of voltage $\Delta V$, such as 50 mV, is selected such that, based on a $6\sigma$ statistical model, a yield of 99.99% will be produced for memory macro 200. Other numbers of $\sigma$ and/or yield values may be chosen, and are within the contemplated scope of the present disclosure. In some embodiments, voltage CVDD is called a cell voltage, and voltage PVDD is called a periphery voltage.

The above explanations with reference to column C[1-1] are for illustrations, and are applicable to other columns of memory macro 200.

Multiplexing

Figure 3:
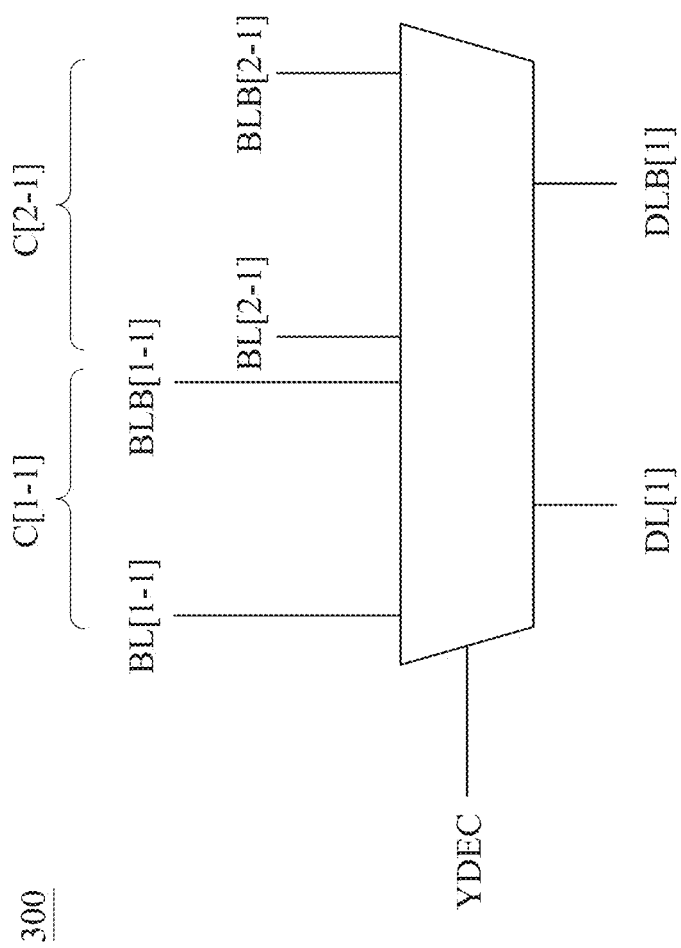
FIG. 3 is a diagram of a selection circuit used in the memory macro of FIG. 2, in accordance with some embodiments.

FIG. 3 is a diagram of a selection circuit in the form of a multiplexer 300, in accordance with some embodiments. Based on a select signal YDEC, multiplexer 300 is used to select a pair of bit lines BL[1-1], BLB[1-1] of column C[1-1] or a pair of bit lines BL[2-1], BLB[2-1] of column C[2-1] to provide data to a corresponding pair of data lines DL[1], DLB[1].

Another selection circuit, for example, a multiplexer 300' (not shown) similar to multiplexer 300, is used to select a pair of bit lines BL[1-2], BLB[1-2] of column C[1-2] or a pair of bit lines BL[2-2], BLB[2-2] of column C[2-2] to provide data to a corresponding pair of data lines DL[2] (not shown), DLB[2] (not shown).

Two columns coupled with a corresponding multiplexer 300 or 300' are for illustration, and are called multiplexing of two. A different number of columns coupled with a multiplexer is within the contemplated scope of the present disclosure. In other words, multiplexing a number different from two is within the contemplated scope of the present disclosure. For example, in a multiplexing-of-three architecture, memory macro 200 includes a column C[3-1] (not shown), which has transistors P[3-1,RB] (not shown) and P[3-1,WB] (not shown) that are configured in manner similar to column C[1-1] having transistors P[1-1,RB] and P[1-1,WB]. Further, bit lines BL[3-1] (not shown) and BLB[3-1] (not shown) are coupled with multiplexer 300 in a manner similar to bit lines BL[1-1] and BLB[1-1] coupled with multiplexer 300. Effectively, multiplexer 300 selects one of the pairs of bit lines BL[1-1] and BLB[1-1], BL[2-1] and BLB[2-1], or BL[3-1] and BLB[3-1] to provide data to the pair of data lines DL[1] and DLB[1].

As a further example, in a multiplexing-of-three architecture, memory macro 200 also includes a column C[3-2] (not shown), which has transistors P[3-2,RB] (not shown) and P[3-2,WB] (not shown) configured in manner similar to column C[1-2] having transistors P[1-2,RB] and P[1-2,WB]. Further, bit lines BL[3-2] (not shown) and BLB[3-2] (not shown) are coupled with multiplexer 300' in a manner similar to bit lines BL[1-2] and BLB[1-2] coupled with multiplexer 300'. Effectively, multiplexer 300' selects one of the pairs of bit lines BL[1-2] and BLB[1-2], BL[2-2] and BLB[2-2], or BL[3-2] and BLB[3-2] to provide data to the pair of data lines DL[2] (not shown) and DLB[2] (not shown).

Two multiplexers 300 and 300' used in memory macro 200 in FIG. 2 are for illustrations. A different number of multiplexers is within the contemplated scope of the present disclosure. The number of multiplexers depends on the number of columns and the multiplexing architecture of memory macro 200. For example, if memory macro 200 includes 64 columns with a multiplexing-of-4 architecture, 16 (=64/4) multiplexers would be used.

Waveforms

In some embodiments, a memory cell under a write operation causes a dummy read to memory cells coupled to the same word line with the memory cell under the write operation. For illustration, an integer i is a number between 1 and N. If memory cell 100[1-1,i] is under a write operation, word line WL[i] is activated during the write operation and causes a dummy read to memory cells coupled to word line WL[i], including memory cells 100[2-1, i], 100[1-2,i], and 100[2-2,i], for example.

In some embodiments, memory cells in a column that has a memory cell under a write operation are configured to receive periphery voltage PVDD. Further, memory cells in a column that has a memory cell under a dummy read are configured to receive voltage CVDD. In some embodiments, CVDD=PVDD+ΔV. Effectively, memory cells in the column that has a memory cell under a dummy read receive a voltage value ΔV higher than a voltage value of periphery voltage PVDD. As a result, disturb on the cell is reduced and/or avoided, as explained below.

Figure 4:
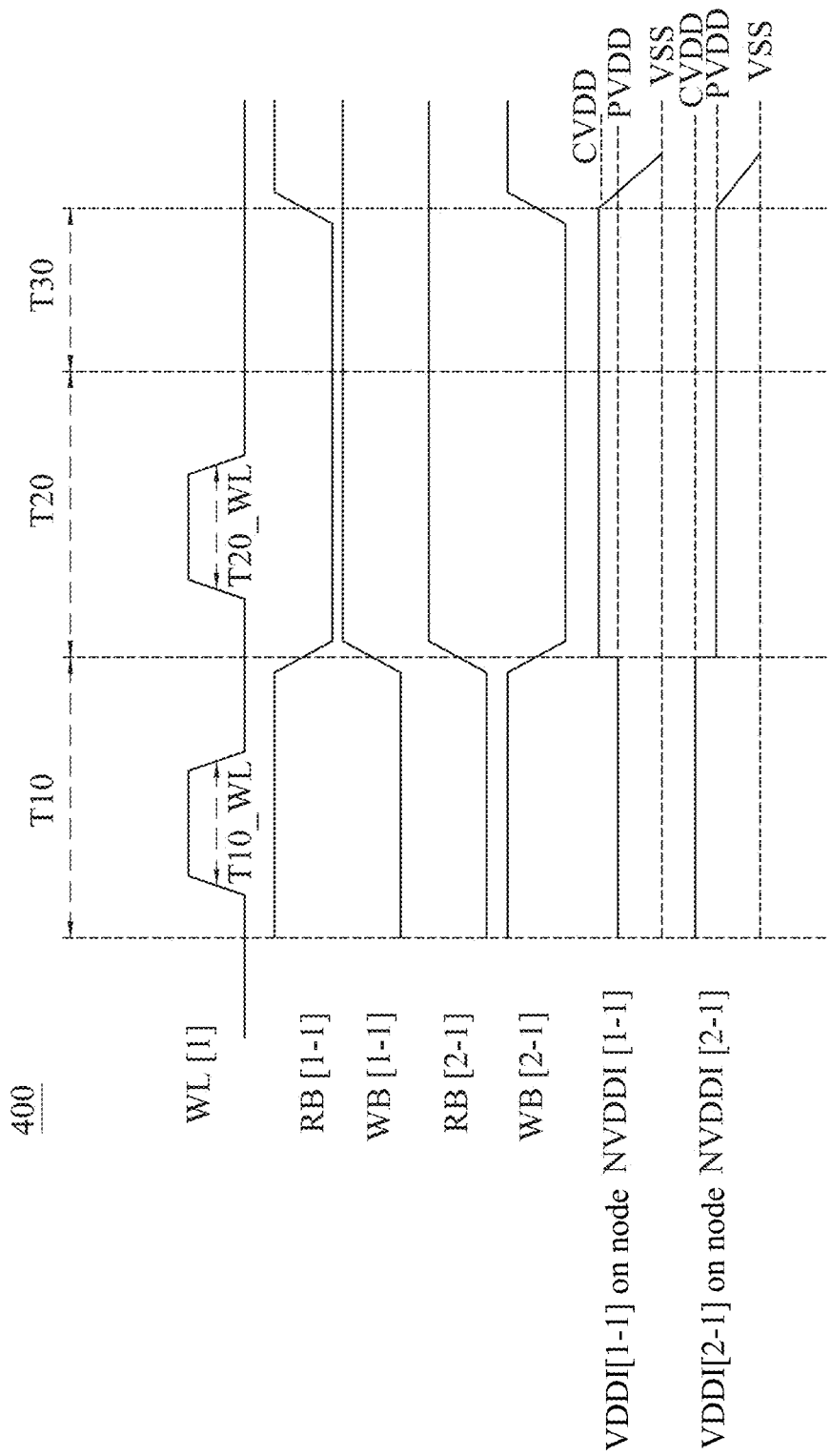
FIG. 4 is a graph of waveforms illustrating operations of the memory macro in FIG. 2, in accordance with some embodiments.

FIG. 4 is a graph of waveforms 400, in accordance with some embodiments. Waveforms 400 illustrate operations of columns C[1-1] and C[2-1] with reference to multiplexer 300 in FIG. 3. Operations of other columns including columns C[1-2] and C[2-2] are similar.

For illustration, during a period T10_WL in a period T10, word line WL[1] is activated with a high logical value, and memory cell 100[1-1,1] in column C[1-1] is under a write operation. Because word line WL[1] is active and word line WL[1] is also coupled with memory cell 100[2-1,1] in column C[2-1], memory cell 100[2-1, 1] is under a dummy read operation. Effectively, memory cell 100[1-1,1] is under a write operation and memory cell 100[2-1-,1] is under a dummy read operation.

With references to the signals, in period T10, signal RB[1-1] is applied with a high logical value. As a result, transistor P[1-1,RB] is turned off, acts as an open circuit, and has no electrical effect on node NVDDI[1-1]. In contrast, signal WB[1-1] is applied with a low logical value, and transistor P[1-1,WB] is therefore turned on. As a result, voltage PVDD at the source of transistor P[1-1,WB] is transferred to node NVDDI[1-1] that is coupled to nodes NVDDI of memory cells in column C[1-1]. Consequently, nodes NVDDI of memory cells in column C[1-1] receives voltage PVDD. Effectively, node NVDDI of memory cell 100[1-1,1] receives voltage PVDD.

With reference to column C[2-1], within period T10, signal WB[2-1] is applied with a high logical value. As a result, transistor P[2-1,WB] is turned off, acts as an open circuit, and has no electrical effect on node NVDDI[2-1]. In contrast, signal RB[2-1] is applied with a low logical value, and transistor P[2-1,RB] is turned on. As a result, voltage CVDD at the source of transistor P[2-1,RB] is transferred to node NVDDI[2-1] that is coupled to nodes NVDDI of memory cells in column C[2-1]. Consequently, nodes NVDDI of memory cells 100[2-1,1] to 100[2-1,N] in column C[2-1] receive voltage CVDD. In other words, node NVDDI of memory cell 100[2-1,1] receives voltage CVDD.

In some embodiments, memory cells coupled to the same word line WL[1] of the memory cell under a write operation are under a dummy read condition. In embodiments having multiplexing of three or higher, transistors that correspond to transistors P[2-1,RB] and P[2-1,WB] of column C[2-1] and that are in columns that have memory a memory cell under a dummy read condition are configured in a manner similar to transistors P[2-1,RB] and P[2-1,WB] of column C[2-1]. As a result, nodes NVDDI of memory cells in the columns that have a memory cell under a dummy read condition receive voltage CVDD. For example, in a multiplexing of three architecture having a column C[3-1] (not shown), for example, transistors P[3-1, RB] (not shown) and P[3-1,WB]

(not shown) are configured such that nodes NVDDI of memory cells in columns C[3-1] receives voltage CVDD.

During period T20_WL in period T20, word line WL[1] is activated with a high logical value, and memory cell 100[2-1,1] in column C[2-1] is under a write operation. Because word line WL[1] is active and word line WL[1] is also coupled with memory cell 100[1-1,1] in column C[1-1], memory cell 100[1-1, 1] is under a dummy read operation. In other words, memory cell 100[2-1,1] is under a write operation and memory cell 100[1-1-,1] is under a dummy read operation With reference to the signals, in period T20, signal RB[2-1] is applied with a high logical value. As a result, transistor P[2-1,RB] is turned off, acts as an open circuit, and has no electrical effect on node NVDDI[2-1]. In contrast, signal WB[2-1] is applied with a low logical value, and transistor P[2-1,WB] is therefore turned on. As a result, voltage PVDD at the source of transistor P[2-1,WB] is transferred to node NVDDI[2-1]. Consequently, node NVDDI of transistor P[2-1,WB] receives voltage PVDD.

With reference to column C[1-1], within period T20, signal WB[1-1] is applied with a high logical value. As a result, transistor P[1-1,WB] is turned off, acts as an open circuit, and has no electrical effect on node NVDDI[1-1]. In contrast, signal RB[1-1] is applied with a low logical value, and transistor P[1-1,RB] is turned on. As a result, voltage CVDD at the source of transistor P[1-1,RB] is transferred to node NVDDI[1-1] that is coupled to nodes NVDDI of memory cells in column C[1-1]. Effectively, nodes NVDDI of memory cells 100[1-1,1] to 100[1-1,N] in column C[1-1] receive voltage CVDD. In other words, node NVDDI of memory cell 100[1-1,1] receives voltage CVDD.

In some embodiments, memory cells coupled to the same word line WL[1] of the memory cell under a write operation are under a dummy read condition. In some embodiments having multiplexing of three or higher, transistors that correspond to transistors P[1-1,RB] and P[1-1,WB] of column C[1-1] and that are in the columns that have a memory cell under a dummy read condition are configured in a manner similar to transistors P[1-1,RB] and P[1-1,WB] of column C[1-1]. As a result, nodes NVDDI of memory cells in the columns that have a memory cell under a dummy read condition receive voltage CVDD. For example, in a multiplexing of three architecture having a column C[3-1] (not shown), for example, transistors P[3-1, RB] (not shown) and P[3-1,WB] (not shown) are configured such that nodes NVDDI of memory cells in columns C[3-1] receives voltage CVDD.

In period T30, as word line WL[1] is applied with a low logical value, and memory macro 200 is in a standby mode.

After period T30, nodes NVDD[1-1] and NVDD[2-1] transition to reference voltage VSS, and memory macro 200 transition into a shutdown mode.

Various embodiments of the present disclosure are advantageous over other approaches. For example, based on the switching circuits of memory macro 200, memory macro 200 continues to function with both voltages CVDD and PVDD that are lower than corresponding voltages CVDD and PVDD in other approaches. For example, in some other approaches, while voltage PVDD can be further lowered, voltage CVDD needs to stay at a certain value and cannot be lowered to the extent that voltage PVDD is lowered, or the corresponding memory macro would not function properly. In contrast, in various embodiments of the present disclosure, both voltages CVDD and PVDD can be lowered, and memory macro 20 continues to function properly. For another example, in various embodiments of the present disclosure, the periphery circuits of memory macro 200, including word line driver 210, are at voltage PVDD while memory cells 100 of memory macro 200 are at voltage CVDD. Further word line driver 210 provides voltage PVDD as a high logical value to word line WL. In contrast, in approaches that have voltage CVDD as a high logical voltage value for word line WL, voltage CVDD cannot be lowered or the corresponding memory macro would not function properly. As a result, in those approaches, even if the system using memory macro 200 is in a standby mode, the system still uses a relatively high voltage CVDD. In contrast, in various embodiments of the present disclosure, because word line driver 210 is powered by voltage PVDD and provides voltage PVDD as a high logical value for word line WL, both voltage PVDD and CVDD can be lowered. Consequently, in various embodiments of the present disclosure, the system using memory macro 200, when in a standby mode, uses less (standby) current than other approaches. Explained in a different way, leakage current (in the standby mode) of the present disclosure is reduced, compared with other approaches. Further, because both voltages PVDD and CVDD of memory macro 200 can be lowered compared with other approaches, the active current caused by switching between ground and voltage PVDD and/or CVDD is also lowered compared to other approaches.

In some embodiments, memory cells in a column that has a memory cell under a write operation are configured to receive voltage PVDD. As a result, writing to the memory cell is easier compared with approaches in which the memory cell under a write operation receives voltage CVDD.

For illustration, a memory cell such as memory cell 100 is under a dummy read condition. Further, node VDDI of the memory cell is at voltage CVDD, word line WL is activated having voltage PVDD as a high logical value, nodes ND stores a low logical value, the corresponding node NDB stores a high logical value, and both bit lines BL and BLB are pre-charged to a high logical value. Because bit line BL is logically high, node ND is pulled towards the high logical value of bit line BL. In other words, a voltage value on node ND is increased, and node ND has a voltage bump. When the voltage bump is relatively high and/or voltage VDD of the memory cell is relatively low, the data in node ND is flipped. Explained in another way, the memory cell is disturbed. In accordance with various embodiments of the present disclosure, word line driver 210 provides a voltage PVDD to the corresponding word line WL as a value for the high logical value of word line WL. Because voltage PVDD is lower than voltage CVDD at node VDDI of the memory cell, transistor N3 of the memory cell is weakened and a turn-on current Ion (not label) of transistor N3 is less compared with the situation in which word line WL receives voltage CVDD. As a result, the voltage bump at node ND is reduced. Effectively, the chance for the disturb condition of the memory cell is reduced and/or eliminated. Consequently, various embodiments of the present disclosure are advantageous over other approaches.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

In an embodiment, a memory macro includes: word lines; memory cells arranged in an array, the array including rows and columns, the rows corresponding to the word lines, each memory cell being configured to receive a first reference voltage, and each column having voltage supply nodes corresponding to corresponding ones of the memory cells in the column; and switching circuits corresponding to the columns, each switching circuit being configured to selectively provide a first voltage value of a first voltage source or a second voltage value of a second voltage source to the voltage supply nodes; and wherein the first voltage value and the second voltage value differ by a predetermined voltage value; each of the first and second voltage values is different than a second reference supply voltage; and the word lines are configured to receive the second voltage value as a voltage value representing a high logical value of the word lines. In an embodiment, when a chosen one of the columns is under the write operation, the remaining ones of the columns are under corresponding dummy read operations. In an embodiment, a given one of the word lines is activated if the given word line has the second voltage value. In an embodiment, the second voltage value is lower than the first voltage value. In an embodiment, a first memory cell in a first column is configured to have the second voltage value when the first memory cell is under a write operation; and a second memory cell in a second column is configured to have the first voltage value when the first memory cell is under the write operation. In an embodiment, a selected one or more of the word lines is activated during a write operation, thereby defining an elapse of the write operation; and each switching circuit is further configured to selectively provide the corresponding first voltage value or the second voltage value substantially for an entirety of the write operation.

In an embodiment, a method for performing a memory write operation on memory cells in a memory macro, the memory cells being arranged in an array, the array including rows corresponding to word lines and columns, one or more of the columns being selectively chosen by corresponding selection circuits, and when a chosen one of the columns is under the write operation and the remaining columns are not under a write operation, the method including: providing each memory cell with a first reference voltage; providing, by a corresponding one of the switching circuits, a first voltage value of a first voltage source or a second voltage value of a second source to all memory cells in the chosen column, each of the first and second voltage values being different than a second reference supply voltage; providing, by corresponding remaining ones of the switching circuits, all memory cells in the remaining columns with the other of the first voltage value or the second voltage value; and providing the word lines with the second voltage value as a voltage value for a high logical value; and wherein the second voltage value differs from the first voltage value; and each of the first and second voltage values is different than a second reference supply voltage. In an embodiment, a given one of the columns is under a write operation if the corresponding one of the word lines is activated. In an embodiment, a given one of the columns is under a write operation if the corresponding one of the word lines is activated; and a given one of the word lines is activated if the given word line has the second voltage value. In an embodiment, the method further includes: subjecting, when the chosen one of the columns is under the write operation, the remaining ones of the columns to corresponding dummy read operations. In an embodiment, the first voltage value and the second voltage value differ by a predetermined voltage value; and the first voltage value and the second voltage value are adjustable. In an embodiment, the second voltage value is lower than the first voltage value. In an embodiment, a difference between the first voltage value and the second voltage value is calculated based on simulation. In an embodiment, the providing, by a corresponding one of the switching circuits, a first voltage value of a first voltage source or a second voltage value of a second source to all memory cells in the chosen column is performed for substantially for an entirety of the write operation upon the chosen column; and the providing, by corresponding remaining ones of the switching circuits, all memory cells in the remaining columns with the other of the first voltage value or the second voltage value is performed for substantially for the entirety of the write operation upon the chosen column.

In some embodiments, a memory macro includes: word lines; memory cells arranged in an array, the array including rows and columns, the rows corresponding to the word lines, each memory cell being configured to receive a first reference voltage, and each column having voltage supply nodes corresponding to corresponding ones of the memory cells in the column; switching circuits corresponding to the columns, each switching circuit being configured to selectively provide a first voltage value of a first voltage source or a second voltage value of a second voltage source to the voltage supply nodes; and a word line driver configured to drive the word lines including providing the word lines with the second voltage value as a voltage value for a high logical value of the word lines, and activating a selected one or more of the word lines during a write operation, thereby defining an elapse of the write operation; and wherein the first voltage value and the second voltage value differ by a predetermined voltage value; and each of the first and second voltage values being different than a second reference supply voltage. In an embodiment, a first memory cell in a first column is configured to have the second voltage value when the first memory cell is under a write operation; and a second memory cell in a second column is configured to have the first voltage value when the first memory cell is under the write operation. In an embodiment, when a chosen one of the columns is under the write operation, the remaining ones of the columns are under corresponding dummy read operations. In an embodiment, a given one of the word lines is activated if the given word line has the second voltage value. In an embodiment, each switching circuit includes: a first P-type transistor having a first source, a first gate, and a first drain; and a second P-type transistor having a second source, a second gate, and a second drain; the first drain and the second drain are coupled to the voltage supply voltage nodes; the first source is coupled to receive the first voltage value from the first voltage source; the second source is coupled to receive the second voltage value from the second voltage source; the first gate is configured to receive a first control signal; and the second gate is configured to receive a second control signal different from the first control signal. In an embodiment, each switching circuit is further configured to selectively provide the corresponding first voltage value or the second voltage value substantially for an entirety of the write operation.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A memory macro comprising:
   word lines;
   memory cells arranged in an array, the array including rows and columns, the rows corresponding to the word lines;
      each memory cell being configured to receive a first reference voltage; and
      each column having voltage supply nodes corresponding to corresponding ones of the memory cells in the column; and
   switching circuits corresponding to the columns;
      each switching circuit being configured to selectively provide a first voltage value of a first voltage source or a second voltage value of a second voltage source to the voltage supply nodes; and
   wherein:
      the first voltage value and the second voltage value differ by a predetermined voltage value;
      each of the first and second voltage values is different than a second reference supply voltage; and
      the word lines are configured to receive the second voltage value as a voltage value representing a high logical value of the word lines.

2. The memory macro of claim 1, wherein:
   when a chosen one of the columns is under a write operation, remaining ones of the columns are under corresponding dummy read operations.

3. The memory macro of claim 1, wherein:
   a given one of the word lines is activated if the given word line has the second voltage value.

4. The memory macro of claim 1, wherein
   the second voltage value is lower than the first voltage value.

5. The memory macro of claim 1, wherein:
   a first memory cell in a first column is configured to have the second voltage value when the first memory cell is under a write operation; and
   a second memory cell in a second column is configured to have the first voltage value when the first memory cell is under the write operation.

6. The memory macro of claim 1, wherein:
   a selected one or more of the word lines is activated during a write operation, thereby defining an elapse of the write operation; and
   each switching circuit is further configured to selectively provide the corresponding first voltage value or the second voltage value substantially for an entirety of the write operation.

7. A method for performing a write operation on memory cells in a memory macro,
   the memory cells being arranged in an array, the array including rows corresponding to word lines and columns,
   one or more of the columns being selectively chosen by corresponding selection circuits, and
   when a chosen one of the columns is under a write operation and remaining columns are not under a write operation,
   the method comprising:
      providing each memory cell with a first reference voltage;
      providing, by a corresponding one of switching circuits, a first voltage value of a first voltage source or a second voltage value of a second source to all memory cells in the chosen column, each of the first and second voltage values being different than a second reference supply voltage;
      providing, by corresponding remaining ones of the switching circuits, all memory cells in the remaining columns with an other one of the first voltage value or the second voltage value; and
      providing word lines with the second voltage value as a voltage value for a high logical value; and
   wherein:
      the second voltage value differs from the first voltage value; and
      each of the first and second voltage values is different than a second reference supply voltage.

8. The method of claim 7, wherein:
   a given one of the columns is under a write operation if the corresponding one of the word lines is activated.

9. The method of claim 7, wherein:
   a given one of the columns is under a write operation if the corresponding one of the word lines is activated; and
   a given one of the word lines is activated if the given word line has the second voltage value.

10. The method of claim 7, the method further comprises:
    subjecting, when the chosen one of the columns is under the write operation, remaining ones of the columns to corresponding dummy read operations.

11. The method of claim 7, wherein:
    the first voltage value and the second voltage value differ by a predetermined voltage value; and
    the first voltage value and the second voltage value are adjustable.

12. The method of claim 7, wherein:
    the second voltage value is lower than the first voltage value.

13. The method of claim 7, wherein a difference between the first voltage value and the second voltage value is calculated based on simulation.

14. The method of claim 7, wherein
    the providing, by a corresponding one of the switching circuits, a first voltage value of a first voltage source or a second voltage value of a second source to all memory cells in the chosen column is performed for substantially for an entirety of the write operation upon the chosen column; and
    the providing, by corresponding remaining ones of the switching circuits, all memory cells in the remaining columns with the other of the first voltage value or the second voltage value is performed for substantially for the entirety of the write operation upon the chosen column.

15. A memory macro comprising:
    word lines;
    memory cells arranged in an array, the array including rows and columns, the rows corresponding to the word lines;
       each memory cell being configured to receive a first reference voltage; and
       each column having voltage supply nodes corresponding to corresponding ones of the memory cells in the column;

switching circuits corresponding to the columns;
   each switching circuit being configured to selectively provide a first voltage value of a first voltage source or a second voltage value of a second voltage source to the voltage supply nodes; and
a word line driver configured to drive the word lines including:
   providing the word lines with the second voltage value as a voltage value for a high logical value of the word lines; and
wherein:
   the first voltage value and the second voltage value differ by a predetermined voltage value;
   activating a selected one or more of the word lines during a write operation, thereby defining an elapse of the write operation; and
   each of the first and second voltage values being different than a second reference supply voltage.

16. The memory macro of claim 15, wherein:
a first memory cell in a first column is configured to have the second voltage value when the first memory cell is under a write operation; and
a second memory cell in a second column is configured to have the first voltage value when the first memory cell is under the write operation.

17. The memory macro of claim 15, wherein:
when a chosen one of the columns is under the write operation, remaining ones of the columns are under corresponding dummy read operations.

18. The memory macro of claim 15, wherein:
a given one of the word lines is activated if the given word line has the second voltage value.

19. The memory macro of claim 15, wherein each switching circuit includes:
   a first P-type transistor having a first source, a first gate, and a first drain; and
   a second P-type transistor having a second source, a second gate, and a second drain;
the first drain and the second drain are coupled to the voltage supply voltage nodes;
the first source is coupled to receive the first voltage value from the first voltage source;
the second source is coupled to receive the second voltage value from the second voltage source;
the first gate is configured to receive a first control signal; and
the second gate is configured to receive a second control signal different from the first control signal.

20. The memory macro of claim 1, wherein:
each switching circuit is further configured to selectively provide the corresponding first voltage value or the second voltage value substantially for an entirety of a write operation.

* * * * *